(12) United States Patent
Song et al.

(10) Patent No.: US 10,658,988 B1
(45) Date of Patent: May 19, 2020

(54) OPEN-LOOP CLASS-D AMPLIFIER SYSTEM WITH ANALOG SUPPLY RAMPING

(71) Applicant: Cirrus Logic International Semiconductor Ltd., Edinburgh (GB)

(72) Inventors: Miao Song, Austin, TX (US); Xiaofan Franky Fei, Austin, TX (US); Xin Zhao, Austin, TX (US); Tejasvi Das, Austin, TX (US); Lei Zhu, Austin, TX (US); Jing Bai, Tempe, AZ (US); Alan Mark Morton, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 57 days.

(21) Appl. No.: 15/943,125

(22) Filed: Apr. 2, 2018

(51) Int. Cl.
| | |
|---|---|
| *H03F 99/00* | (2009.01) |
| *H03F 3/217* | (2006.01) |
| *H03F 3/38* | (2006.01) |
| *H03F 3/187* | (2006.01) |
| *H03F 1/02* | (2006.01) |
| *H03G 3/30* | (2006.01) |
| *H03F 3/213* | (2006.01) |

(52) U.S. Cl.
CPC .............. *H03F 3/187* (2013.01); *H03F 1/02* (2013.01); *H03F 3/213* (2013.01); *H03F 3/217* (2013.01); *H03G 3/301* (2013.01); *H03F 2200/03* (2013.01); *H03F 2200/171* (2013.01)

(58) Field of Classification Search
CPC ......... H03F 3/187; H03F 1/02; H03F 2200/03
USPC ...................................... 381/120, 56; 330/10
See application file for complete search history.

(56) References Cited

U.S. PATENT DOCUMENTS

| | | | | |
|---|---|---|---|---|
| 5,023,564 A | * | 6/1991 | Jobling | H03F 1/083 330/107 |
| 6,388,514 B1 | | 5/2002 | King et al. | |
| 6,597,240 B1 | * | 7/2003 | Walburger | H03F 3/2171 330/10 |
| 6,967,527 B2 | * | 11/2005 | Fukushima | H03F 1/32 330/10 |
| 7,468,632 B2 | * | 12/2008 | Zepp | H03F 1/30 330/10 |
| 7,692,488 B2 | * | 4/2010 | Wong | H03F 1/52 330/10 |
| 8,018,279 B2 | * | 9/2011 | Honda | H03F 3/2173 330/207 A |
| 8,212,390 B1 | * | 7/2012 | Robinson | H02J 1/04 307/150 |
| 8,995,691 B2 | * | 3/2015 | French | H03F 1/0227 381/120 |
| 9,444,517 B2 | * | 9/2016 | Teggatz | H02J 50/12 |
| 9,473,851 B2 | * | 10/2016 | Galal | H03F 1/523 |

(Continued)

*Primary Examiner* — William J Deane, Jr.
(74) *Attorney, Agent, or Firm* — Jackson Walker L.L.P.

(57) ABSTRACT

A signal processing system may include a modulation stage configured to generate a modulated input signal, an open-loop switched mode driver coupled to the modulation stage and configured to generate an output signal from the modulated input signal, a voltage regulator configured to generate a supply voltage that supplies electrical energy to the open-loop switched mode driver, and a control subsystem configured to, when a magnitude of the modulated input signal falls below a threshold magnitude, control the voltage regulator to control the supply voltage such that the output signal varies non-linearly with the modulated input signal for magnitudes of the modulated input signal below the threshold magnitude.

24 Claims, 3 Drawing Sheets

(56) References Cited

U.S. PATENT DOCUMENTS

| | | | |
|---|---|---|---|
| 9,742,357 B2* | 8/2017 | Olson | H03F 3/185 |
| 9,825,600 B2* | 11/2017 | Sun | H03F 3/217 |
| 9,979,354 B2* | 5/2018 | Hoyerby | H03F 3/2173 |
| 2008/0012639 A1* | 1/2008 | Mels | H03F 1/02 |
| | | | 330/251 |
| 2010/0244974 A1* | 9/2010 | Greiss | H03F 3/217 |
| | | | 332/112 |
| 2011/0050467 A1* | 3/2011 | Crespi | H03F 3/217 |
| | | | 341/50 |
| 2018/0351523 A1* | 12/2018 | Lesso | H03F 3/187 |

* cited by examiner

(12) United States Patent
US 10,658,988 B1

OPEN-LOOP CLASS-D AMPLIFIER SYSTEM WITH ANALOG SUPPLY RAMPING

FIELD OF DISCLOSURE

The present disclosure relates in general to circuits for audio devices, including without limitation personal audio devices such as wireless telephones and media players, and more specifically, to systems and methods for minimizing power consumption in an audio signal path in an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

Because personal audio devices often operate using electrical energy drawn from a battery, it is often desirable that personal audio devices and their components draw as little power as possible from the battery.

SUMMARY

In accordance with the teachings of the present disclosure, one or more disadvantages and problems associated with existing approaches to avoiding signal distortion in a signal processing system may be reduced or eliminated.

In accordance with embodiments of the present disclosure, a signal processing system may include a modulation stage configured to generate a modulated input signal, an open-loop switched mode driver coupled to the modulation stage and configured to generate an output signal from the modulated input signal, a voltage regulator configured to generate a supply voltage that supplies electrical energy to the open-loop switched mode driver, and a control subsystem configured to, when a magnitude of the modulated input signal falls below a threshold magnitude, control the voltage regulator to control the supply voltage such that the output signal varies non-linearly with the modulated input signal for magnitudes of the modulated input signal below the threshold magnitude.

In accordance with these and other embodiments of the present disclosure, a method is provided for use in a signal processing system comprising a modulation stage configured to generate a modulated input signal, an open-loop switched mode driver coupled to the modulation stage and configured to generate an output signal from the modulated input signal, and a voltage regulator configured to generate a supply voltage that supplies electrical energy to the open-loop switched mode driver. The method may include, when a magnitude of the modulated input signal falls below a threshold magnitude, controlling the voltage regulator to control the supply voltage such that the output signal varies non-linearly with the modulated input signal for magnitudes of the modulated input signal below the threshold magnitude.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
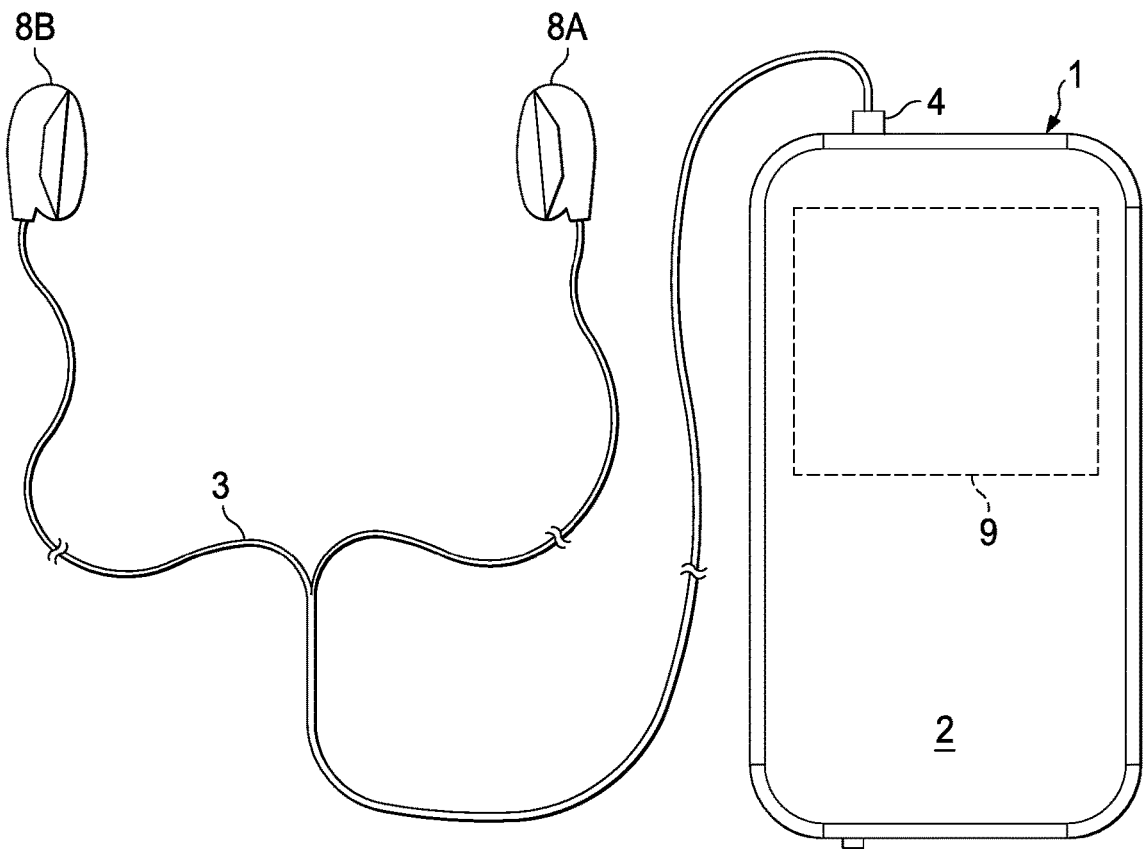
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
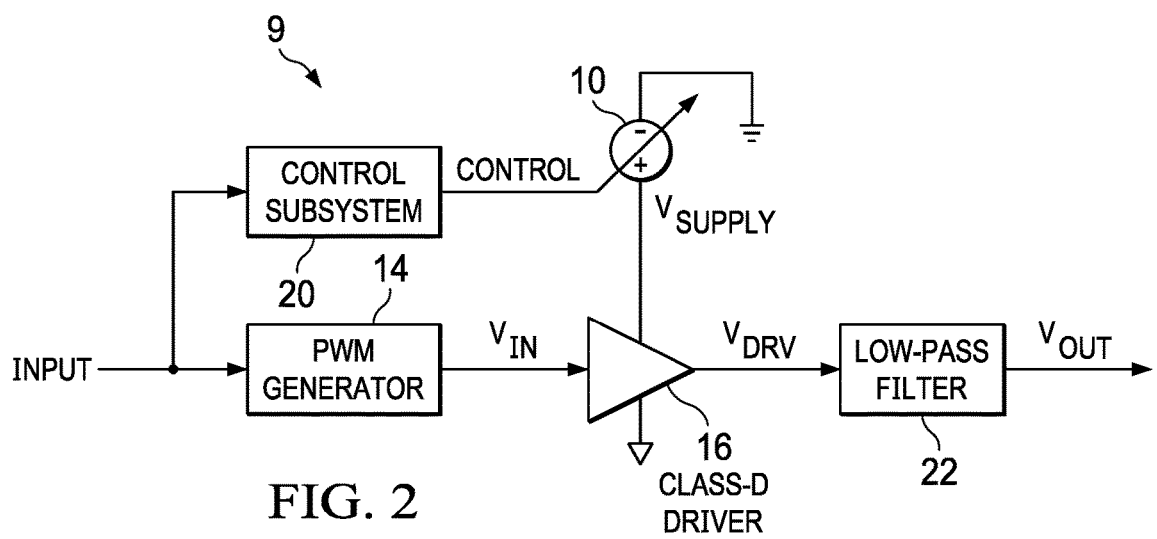
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, PWM generator 14 may generate a modulated input signal $V_{IN}$ as a pulse-width modulated signal based on an input signal INPUT. A Class-D driver 16 may receive modulated input signal $V_{IN}$ and output a modulated output signal $V_{DRV}$ that may be filtered by a low-pass filter 22 to generate an analog output signal $V_{OUT}$, which may be driven to a transducer (e.g., one or more of speakers 8A and 8B) for playback of audio sound. Thus, together Class-D driver 16 and low-pass filter 22 form a driver stage configured to generate analog output signal $V_{OUT}$ from modulated input signal $V_{IN}$ output by PWM modulator 14. As shown in FIG. 2, Class-D driver 16 may be powered from a supply voltage $V_{SUPPLY}$ generated by a variable supply 10.

Variable voltage supply 10 may comprise any suitable system, device, or apparatus configured to generate a regulated supply voltage $V_{SUPPLY}$ for powering Class-D driver 16 of audio IC 9. For example, in some embodiments, variable voltage supply 10 may comprise a voltage regulator, such as a low-drop out (LDO) regulator. As its name indicates, regulated supply voltage $V_{SUPPLY}$ may be variable based on one or more control signals CONTROL communicated from control subsystem 20, as described in greater detail below.

Control subsystem 20 may comprise any suitable system, device, or apparatus configured to, based on modulated input signal $V_{IN}$ or another signal indicative of modulated input signal $V_{IN}$ (e.g., input signal INPUT as shown in FIG. 2), generate one or more control signals CONTROL for controlling regulated supply voltage $V_{SUPPLY}$. For example, when a magnitude of modulated input signal $V_{IN}$ is above a threshold magnitude, control subsystem 20 may control variable voltage supply 10 to generate a constant regulated supply voltage $V_{SUPPLY}$. However, when a magnitude of the modulated input signal falls below the threshold magnitude, control subsystem 20 may control variable voltage supply 10 to control regulated supply voltage $V_{SUPPLY}$ such that modulated output signal $V_{DRV}$ (and accordingly, analog output signal $V_{OUT}$) varies non-linearly with modulated input signal $V_{IN}$ for magnitudes of the modulated input signal $V_{IN}$ below the threshold magnitude. In order to do so, in some embodiments, control subsystem 20 may, when the magnitude of modulated input signal $V_{IN}$ is below a threshold magnitude, ramp supply voltage $V_{SUPPLY}$ as a function of the magnitude of modulated input signal $V_{IN}$. In such embodiments, control subsystem 20 may be configured to, when the magnitude of modulated input signal $V_{IN}$ is below a threshold magnitude, increase supply voltage $V_{SUPPLY}$ when the magnitude of modulated input signal $V_{IN}$ increases and decrease supply voltage $V_{SUPPLY}$ when the magnitude of modulated input signal $V_{IN}$ decreases.

Figure 3:
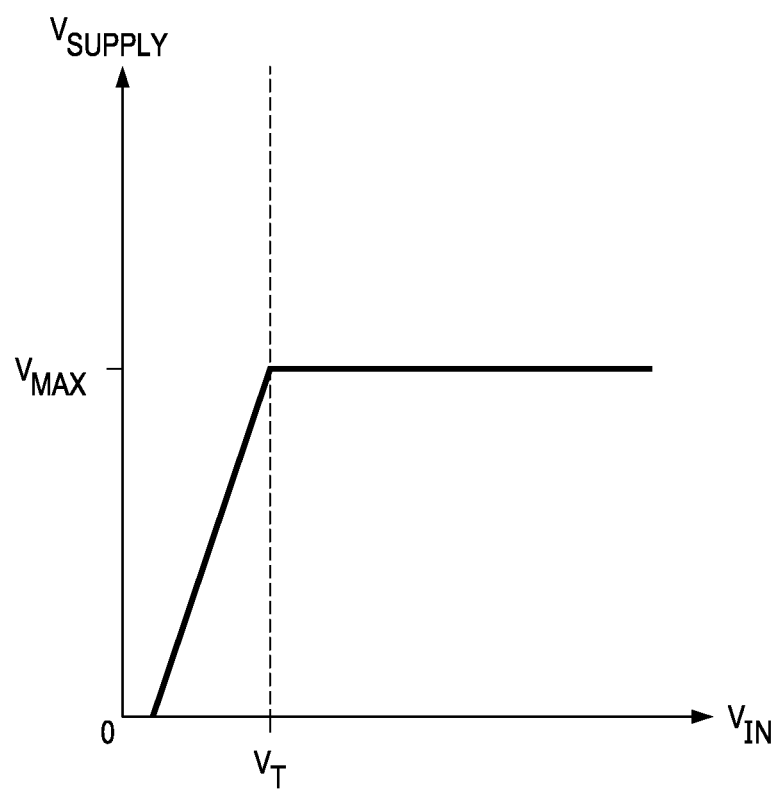
FIG. 3 is an example graph of a regulated supply voltage versus a magnitude of a modulated input signal, in accordance with embodiments of the present disclosure.

FIG. 3 is an example graph of regulated supply voltage $V_{SUPPLY}$ versus magnitude of modulated input signal $V_{IN}$, in accordance with embodiments of the present disclosure. As shown in FIG. 3, and as described above, when a magnitude of modulated input signal $V_{IN}$ is above a threshold magnitude $V_T$, control subsystem 20 may control variable voltage supply 10 to generate regulated supply voltage $V_{SUPPLY}$ at a constant value $V_{MAX}$. As also depicted in FIG. 3, when a magnitude of the modulated input signal falls below the threshold magnitude $V_T$, control subsystem 20 may control variable voltage supply 10 to control regulated supply voltage $V_{SUPPLY}$ so as to ramp supply voltage $V_{SUPPLY}$ as a function of the magnitude of modulated input signal $V_{IN}$ (e.g., when the magnitude of modulated input signal $V_{IN}$ is below threshold magnitude $V_T$, supply voltage $V_{SUPPLY}$ may increase when the magnitude of modulated input signal $V_{IN}$ increases and supply voltage $V_{SUPPLY}$ may decrease when the magnitude of modulated input signal $V_{IN}$ decreases).

Figure 4:
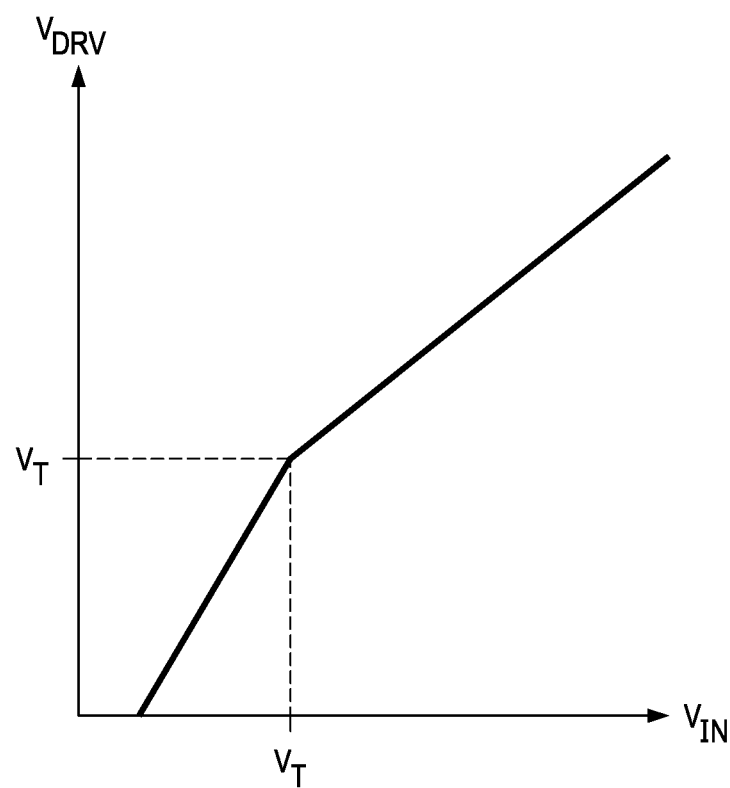
FIG. 4 is an example graph of a magnitude of a modulated output signal versus a magnitude of a modulated input signal, in accordance with embodiments of the present disclosure.

Such varying of supply voltage as a function of modulated input signal $V_{IN}$ for magnitudes of modulated input signal $V_{IN}$ below the threshold magnitude may have the effect of varying a gain of Class-D driver 16 as a function modulated input signal $V_{IN}$ for magnitudes of modulated input signal $V_{IN}$ below the threshold magnitude, thus meaning modulated output signal $V_{DRV}$ may, as shown in FIG. 4, vary in a non-linear fashion as a function of modulated input signal $V_{IN}$ for magnitudes of modulated input signal $V_{IN}$ below the threshold magnitude. FIG. 4 is an example graph of a magnitude of modulated output signal $V_{DRV}$ versus a magnitude of modulated input signal $V_{IN}$, in accordance with embodiments of the present disclosure.

In these and other embodiments, the one or more control signals CONTROL generated by control subsystem 20 may comprise a reference voltage for generating supply voltage $V_{SUPPLY}$, and control subsystem 20 may control supply voltage $V_{SUPPLY}$ by controlling such reference voltage. In such embodiments, control subsystem 20 may implement a ramping function to control the reference voltage as a function of the magnitude of modulated input signal $V_{IN}$ for magnitudes of modulated input signal $V_{IN}$ below the threshold magnitude.

Figure 5:
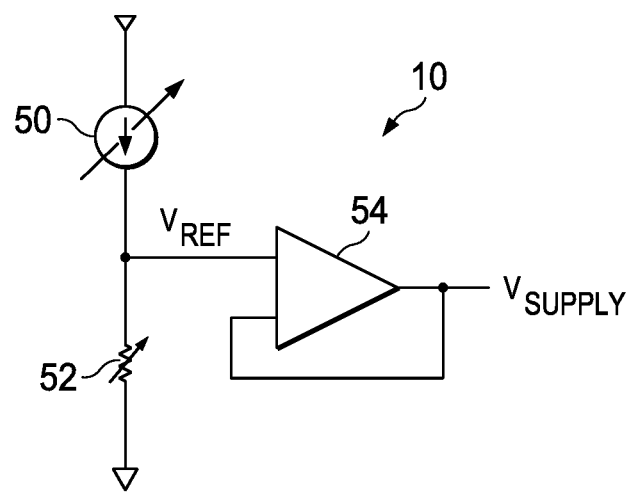
FIG. 5 is a block diagram of selected components of a variable voltage supply, in accordance with embodiments of the present disclosure.

FIG. 5 is a block diagram of selected components of voltage supply 10, in accordance with embodiments of the present disclosure. As shown in FIG. 5, variable voltage supply 10 may generate a reference voltage $V_{REF}$ using a current source 50 and a resistor 52 arranged as shown. As shown in FIG. 5, one or both of current source 50 and resistor 52 may be variable. Thus, voltage $V_{REF}$ may be controllable by varying the current generated by current source 50, the impedance of resistor 52, or both. As also shown in FIG. 5, variable voltage supply 10 may also include an operational amplifier 54 configured to generate regulated supply voltage $V_{SUPPLY}$ from reference voltage $V_{REF}$. Accordingly, a ramping function to control the reference voltage as a function of the magnitude of modulated input signal $V_{IN}$ for magnitudes of modulated input signal $V_{IN}$ below the threshold magnitude as the ramping function may be implemented with at least one of a variable impedance (e.g., of resistor 52) and a variable current source (e.g., current source 50).

In addition to or in lieu of the functionality described above, control subsystem 20 may be configured to control a variable voltage source at power-up of audio IC 9 to increase the regulated supply voltage $V_{SUPPLY}$ at a sufficiently slow rate so as to minimize audio artifacts in the output signal.

Furthermore, in addition to or in lieu of the functionality described above, the systems described above may implement an automute function. For example, when modulated input signal $V_{IN}$ decrease towards zero low magnitude, control subsystem 20 may control variable voltage supply 10 to gradually decrease supply voltage $V_{SUPPLY}$ along with a decrease of modulated input signal $V_{IN}$ until the magnitude of modulated input signal $V_{IN}$ reaches zero, in which case modulated output signal $V_{DRV}$ may be muted by virtue of supply voltage $V_{SUPPLY}$ being zero. Similarly, control subsystem 20 may control variable voltage supply 10 to gradually increase supply voltage $V_{SUPPLY}$ along with an increase in modulated input signal $V_{IN}$ as the magnitude of modulated input signal $V_{IN}$ increases from zero.

Using the systems and methods described above and claimed below, idle channel noise, out-of-band noise, and driver switching loss may be decreased when an input PWM signal (e.g., modulated input signal $V_{IN}$) is of low magnitude.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A signal processing system, comprising:
    a modulation stage configured to generate a modulated input signal;
    an open-loop switched mode driver coupled to the modulation stage and configured to generate an output signal from the modulated input signal;
    a voltage regulator configured to generate a supply voltage that supplies electrical energy to the open-loop switched mode driver; and
    a control subsystem configured to, when a magnitude of the modulated input signal falls below a threshold magnitude, control the voltage regulator to control the supply voltage such that the output signal varies non-linearly with the modulated input signal for magnitudes of the modulated input signal below the threshold magnitude.

2. The signal processing system of claim 1, wherein the open-loop switched mode driver comprises a Class-D driver.

3. The signal processing system of claim 2, wherein the modulated input signal and the output signal are audio signals.

4. The signal processing system of claim 1, wherein the modulation stage comprises a digital pulse-width modulator configured to generate the modulated input signal as a pulse-width modulated signal.

5. The signal processing system of claim 1, wherein the control subsystem is configured to, when the magnitude of the modulated input signal is below a threshold magnitude, ramp the supply voltage as a function of the magnitude of the modulated input signal.

6. The signal processing system of claim 5, wherein the control subsystem is configured to, when the magnitude of the modulated input signal is below a threshold magnitude, increase the supply voltage when the magnitude of the modulated input signal increases and decrease the supply voltage when the magnitude of the modulated input signal decreases.

7. The signal processing system of claim 1, wherein the control subsystem controls the supply voltage by controlling a reference voltage received by the voltage regulator for generating the supply voltage.

8. The signal processing system of claim 7, wherein the control subsystem implements a ramping function to control the reference voltage as a function of the magnitude of the modulated input signal for magnitudes of the modulated input signal below the threshold magnitude.

9. The signal processing system of claim 8, wherein the ramping function is implemented with at least one of a variable impedance and a variable current source.

10. The signal processing system of claim 1, wherein the control subsystem, by controlling the supply voltage such that the output signal varies non-linearly with the modulated input signal, controls a gain of the open-loop switched mode driver as a function of the modulated input signal for magnitudes of the modulated input signal below the threshold magnitude.

11. The signal processing system of claim 1, wherein the control subsystem controls the voltage regulator at power-up of the signal processing system to increase the supply voltage at a sufficiently slow rate so as to minimize audio artifacts in the output signal.

12. The signal processing system of claim 1, wherein the control subsystem controls the voltage regulator to decrease the voltage supply along with a decrease in the modulated input signal in order to automute the output signal.

13. A method for use in a signal processing system comprising a modulation stage configured to generate a modulated input signal, an open-loop switched mode driver coupled to the modulation stage and configured to generate an output signal from the modulated input signal, and a voltage regulator configured to generate a supply voltage that supplies electrical energy to the open-loop switched mode driver, the method comprising:
    when a magnitude of the modulated input signal falls below a threshold magnitude, controlling the voltage regulator to control the supply voltage such that the output signal varies non-linearly with the modulated input signal for magnitudes of the modulated input signal below the threshold magnitude.

14. The method of claim 13, wherein the open-loop switched mode driver comprises a Class-D driver.

15. The method of claim 14, wherein the modulated input signal and the output signal are audio signals.

16. The method of claim 13, wherein the modulation stage comprises a digital pulse-width modulator configured to generate the modulated input signal as a pulse-width modulated signal.

17. The method of claim 13, further comprising, when the magnitude of the modulated input signal is below a threshold magnitude, ramping the supply voltage as a function of the magnitude of the modulated input signal.

18. The method of claim 17, further comprising, when the magnitude of the modulated input signal is below a threshold magnitude, increasing the supply voltage when the magnitude of the modulated input signal increases and decreasing the supply voltage when the magnitude of the modulated input signal decreases.

19. The method of claim 13, further comprising controlling the supply voltage by controlling a reference voltage received by the voltage regulator for generating the supply voltage.

20. The method of claim 19, further comprising implementing a ramping function to control the reference voltage as a function of the magnitude of the modulated input signal for magnitudes of the modulated input signal below the threshold magnitude.

21. The method of claim 20, further comprising implementing the ramping function with at least one of a variable impedance and a variable current source.

22. The method of claim 13, wherein controlling the supply voltage such that the output signal varies non-linearly with the modulated input signal controls a gain of the open-loop switched mode driver as a function of the modulated input signal for magnitudes of the modulated input signal below the threshold magnitude.

23. The method of claim 13, further comprising controlling the voltage regulator at power-up of the signal processing system to increase the supply voltage at a sufficiently slow rate so as to minimize audio artifacts in the output signal.

24. The method of claim 13, further comprising controlling the voltage regulator to decrease the voltage supply along with a decrease in the modulated input signal in order to automute the output signal.

\* \* \* \* \*